United States Patent
David et al.

(10) Patent No.: US 10,644,726 B2
(45) Date of Patent: May 5, 2020

(54) METHOD AND APPARATUS FOR RECONSTRUCTING A DATA BLOCK

(71) Applicants: UNIVERSITE DE NANTES, Nantes (FR); CENTRE NATIONAL DE LA RECHERCHE SCIENTIFIQUE—CNRS, Paris (FR)

(72) Inventors: Sylvain David, Les Landes Génusson (FR); Pierre Evenou, La Chapelle sur Erdre (FR); Jean-Pierre Guedon, Orvault (FR); Nicolas Normand, Vigneux de Bretagne (FR); Benoît Parrein, Nantes (FR)

(73) Assignees: Universite de Nantes, Nantes (FR); Centre National de la Recherce Scientifique—CNRS, Paris (FR)

(*) Notice: Subject to any disclaimer, the term of this patent is extended or adjusted under 35 U.S.C. 154(b) by 0 days.

(21) Appl. No.: 15/030,338

(22) PCT Filed: Oct. 6, 2014

(86) PCT No.: PCT/EP2014/071310
§ 371 (c)(1),
(2) Date: Apr. 18, 2016

(87) PCT Pub. No.: WO2015/055450
PCT Pub. Date: Apr. 23, 2015

(65) Prior Publication Data
US 2016/0254826 A1    Sep. 1, 2016

(30) Foreign Application Priority Data
Oct. 18, 2013  (EP) .................................... 13306435

(51) Int. Cl.
H03M 13/29    (2006.01)
H04L 1/00    (2006.01)
H03M 13/00    (2006.01)

(52) U.S. Cl.
CPC ..... *H03M 13/2942* (2013.01); *H03M 13/611* (2013.01); *H04L 1/0043* (2013.01)

(58) Field of Classification Search
CPC ................................................ H03M 13/2942
See application file for complete search history.

(56) References Cited

U.S. PATENT DOCUMENTS 3,680,058 A    7/1972    De Santis et al.
3,769,453 A    10/1973    Bahl et al.
(Continued)

FOREIGN PATENT DOCUMENTS

CA    2602283    12/1999
CN    101349979    1/2009
(Continued)

OTHER PUBLICATIONS

International Search Report and Written Opinion for PCT/EP2014/071310 dated Dec. 4, 2014, 12 pages.
(Continued)

*Primary Examiner* — Steve N Nguyen
(74) *Attorney, Agent, or Firm* — Patterson Thuente Pedersen, P.A.

(57) ABSTRACT

A method for reconstructing a data block of size N is proposed. The data block was encoded using an erasure code to generate a set of $N_s$ systematic symbol vectors and a set of $N_p$ parity projection vectors from a mapping of the data block onto a two-dimensional convex support. The method comprises: for each input vector that contains at least an erasure, updating the value of each erased symbol to a predetermined value; mapping the $N_s$ input vectors with
(Continued)

updated values onto the two-dimensional convex support, generating a reconstruction projection vector from the mapping of the $N_s$ input vectors with updated values onto the two-dimensional convex support using an encoding projection direction; and generating an updated parity projection vector from the reconstruction projection vector and the parity projection vector generated using said encoding projection direction.

13 Claims, 7 Drawing Sheets

(56) References Cited

U.S. PATENT DOCUMENTS

| | | | |
|---|---|---|---|
| 4,309,721 | A | 1/1982 | Christopher |
| 4,794,597 | A | 12/1988 | Ooba et al. |
| 4,796,260 | A | 1/1989 | Schilling et al. |
| 4,849,974 | A | 7/1989 | Schilling et al. |
| 4,908,826 | A | 3/1990 | Hertrich |
| 5,170,400 | A * | 12/1992 | Dotson ............ G11B 20/1833 714/755 |
| 5,644,695 | A | 7/1997 | Blaum et al. |
| 5,737,344 | A | 4/1998 | Belser et al. |
| 5,778,011 | A | 7/1998 | Blaum et al. |
| 5,903,410 | A | 5/1999 | Blaum et al. |
| 5,953,351 | A | 9/1999 | Hicks et al. |
| 5,999,110 | A | 12/1999 | Blaum et al. |
| 6,089,749 | A | 7/2000 | Blaum et al. |
| 6,141,176 | A | 10/2000 | Blaum et al. |
| 6,141,783 | A | 10/2000 | Ashley et al. |
| 6,226,138 | B1 | 5/2001 | Blaum et al. |
| 6,228,861 | B1 | 5/2001 | Nagarathnam et al. |
| 6,272,178 | B1 | 8/2001 | Nieweglowski et al. |
| 6,429,986 | B1 | 8/2002 | Blaum et al. |
| 6,885,321 | B1 | 4/2005 | Blaum et al. |
| 6,970,987 | B1 | 11/2005 | Ji et al. |
| 7,071,851 | B1 | 7/2006 | Blaum et al. |
| 7,472,334 | B1 | 12/2008 | Scott et al. |
| 7,681,105 | B1 | 3/2010 | Sim-Tang et al. |
| 7,716,250 | B1 | 5/2010 | Manasse et al. |
| 7,734,643 | B1 | 6/2010 | Waterhouse et al. |
| 7,886,034 | B1 | 2/2011 | Hartmann et al. |
| 8,205,139 | B1 | 6/2012 | Sim-Tang et al. |
| 8,335,966 | B1 * | 12/2012 | Lary ................ G06F 11/1076 714/6.24 |
| 8,775,901 | B2 | 7/2014 | Sharon et al. |
| 9,122,952 | B2 * | 9/2015 | Silver ................ G06K 7/1413 |
| 2001/0024335 | A1 | 9/2001 | Blaum et al. |
| 2002/0120905 | A1 | 8/2002 | Blaum et al. |
| 2002/0126407 | A1 | 9/2002 | Blaum et al. |
| 2002/0164084 | A1 | 11/2002 | Baggs |
| 2002/0166094 | A1 | 11/2002 | Blaum et al. |
| 2002/0181599 | A1 | 12/2002 | Choi et al. |
| 2003/0123173 | A1 | 7/2003 | Blaum et al. |
| 2004/0100714 | A1 | 5/2004 | Berman et al. |
| 2004/0117718 | A1 | 6/2004 | Manasse |
| 2004/0123223 | A1 * | 6/2004 | Halford ............ G06F 11/1076 714/781 |
| 2005/0068651 | A1 | 3/2005 | Blaum et al. |
| 2005/0068663 | A1 | 3/2005 | Blaum et al. |
| 2005/0128622 | A1 | 6/2005 | Blaum et al. |
| 2005/0154966 | A1 | 7/2005 | Blaum |
| 2005/0265493 | A1 | 12/2005 | Blaum et al. |
| 2005/0267980 | A1 | 12/2005 | Warren et al. |
| 2006/0087456 | A1 | 4/2006 | Luby |
| 2006/0107091 | A1 | 5/2006 | Hafner et al. |
| 2006/0123321 | A1 | 6/2006 | Deenadhayalan et al. |
| 2006/0170577 | A1 | 8/2006 | Blaum et al. |
| 2006/0170578 | A1 | 8/2006 | Blaum et al. |
| 2006/0174063 | A1 | 8/2006 | Soules et al. |
| 2006/0210176 | A1 | 9/2006 | Kajiwara et al. |
| 2006/0224914 | A1 | 10/2006 | Blaum et al. |
| 2006/0253730 | A1 | 11/2006 | Manasse |
| 2007/0005831 | A1 | 1/2007 | Gregorius |
| 2007/0043997 | A1 | 2/2007 | Yang et al. |
| 2007/0136525 | A1 | 6/2007 | Read |
| 2007/0147371 | A1 | 6/2007 | Radha et al. |
| 2007/0157067 | A1 | 7/2007 | Blaum et al. |
| 2007/0192542 | A1 | 8/2007 | Frolund et al. |
| 2007/0192544 | A1 | 8/2007 | Frolund et al. |
| 2007/0208790 | A1 | 9/2007 | Reuter et al. |
| 2007/0208839 | A1 | 9/2007 | Voigt et al. |
| 2007/0214194 | A1 | 9/2007 | Reuter |
| 2007/0214314 | A1 | 9/2007 | Reuter |
| 2007/0245083 | A1 * | 10/2007 | Margolus ............ G06F 11/1096 711/114 |
| 2007/0245100 | A1 | 10/2007 | Miyoshi |
| 2008/0034273 | A1 | 2/2008 | Luby |
| 2008/0115017 | A1 | 5/2008 | Jacobson |
| 2008/0126842 | A1 | 5/2008 | Jacobson et al. |
| 2008/0151724 | A1 | 6/2008 | Anderson et al. |
| 2008/0155191 | A1 | 6/2008 | Anderson et al. |
| 2008/0204926 | A1 | 8/2008 | Blaum et al. |
| 2008/0221856 | A1 | 9/2008 | Dubnicki et al. |
| 2008/0222480 | A1 | 9/2008 | Huang et al. |
| 2009/0006930 | A1 | 1/2009 | Djurdjevic et al. |
| 2009/0006931 | A1 | 1/2009 | Djurdjevic et al. |
| 2009/0013208 | A1 | 1/2009 | DiMuzio |
| 2009/0083590 | A1 | 3/2009 | Wylie et al. |
| 2009/0157378 | A1 | 6/2009 | Boldyrev et al. |
| 2009/0168227 | A1 | 7/2009 | Blaum et al. |
| 2009/0222712 | A1 * | 9/2009 | Zhong ................ H03M 13/154 714/793 |
| 2009/0235142 | A1 | 9/2009 | Galbraith et al. |
| 2010/0050053 | A1 | 2/2010 | Wilson et al. |
| 2010/0083040 | A1 | 4/2010 | Voigt et al. |
| 2010/0083068 | A1 | 4/2010 | Wylie et al. |
| 2010/0094921 | A1 | 4/2010 | Roy et al. |
| 2010/0094968 | A1 | 4/2010 | Zuckerman et al. |
| 2010/0115335 | A1 | 5/2010 | Wylie et al. |
| 2010/0138717 | A1 | 6/2010 | Wu et al. |
| 2010/0269008 | A1 | 10/2010 | Leggette et al. |
| 2011/0026842 | A1 | 2/2011 | Cilfone et al. |
| 2011/0029840 | A1 | 2/2011 | Ozzie et al. |
| 2011/0035634 | A1 | 2/2011 | Blaum et al. |
| 2011/0078493 | A1 | 3/2011 | Grube et al. |
| 2011/0078534 | A1 | 3/2011 | Resch |
| 2011/0083061 | A1 | 4/2011 | Grube et al. |
| 2011/0106769 | A1 | 5/2011 | Baptist et al. |
| 2011/0106973 | A1 | 5/2011 | Grube et al. |
| 2011/0107181 | A1 | 5/2011 | Markison et al. |
| 2011/0126060 | A1 | 5/2011 | Grube et al. |
| 2011/0126295 | A1 | 5/2011 | Resch |
| 2011/0161655 | A1 | 6/2011 | Gladwin et al. |
| 2011/0161679 | A1 | 6/2011 | Grube et al. |
| 2011/0161781 | A1 | 6/2011 | Gladwin et al. |
| 2011/0184997 | A1 | 7/2011 | Grube et al. |
| 2011/0185141 | A1 | 7/2011 | Dhuse et al. |
| 2011/0208912 | A1 | 8/2011 | Chambliss et al. |
| 2011/0208994 | A1 | 8/2011 | Chambliss et al. |
| 2011/0208995 | A1 | 8/2011 | Hafner et al. |
| 2011/0213929 | A1 | 9/2011 | Baptist et al. |
| 2011/0231699 | A1 | 9/2011 | Gladwin et al. |
| 2011/0238936 | A1 | 9/2011 | Hayden |
| 2011/0265143 | A1 | 10/2011 | Grube et al. |
| 2011/0289577 | A1 | 11/2011 | Resch et al. |
| 2012/0011398 | A1 | 1/2012 | Eckhardt et al. |
| 2012/0017140 | A1 | 1/2012 | Wylie et al. |
| 2012/0047111 | A1 | 2/2012 | Hayden et al. |
| 2012/0060072 | A1 | 3/2012 | Simitci et al. |
| 2012/0066567 | A1 | 3/2012 | Moyer |
| 2012/0102316 | A1 | 4/2012 | Resch et al. |
| 2012/0109885 | A1 | 5/2012 | Grube et al. |
| 2012/0173932 | A1 | 7/2012 | Li et al. |
| 2012/0198195 | A1 | 8/2012 | Wylie |
| 2012/0221920 | A1 | 8/2012 | Blaum et al. |
| 2012/0226855 | A1 | 9/2012 | Dhuse |
| 2012/0226934 | A1 | 9/2012 | Rao |
| 2012/0226960 | A1 | 9/2012 | Grube et al. |
| 2012/0254689 | A1 | 10/2012 | Resch |
| 2012/0254692 | A1 | 10/2012 | Resch et al. |

(56) References Cited

U.S. PATENT DOCUMENTS

| | | | | |
|---|---|---|---|---|
| 2012/0278689 | A1* | 11/2012 | Tamo | G06F 11/1092 714/805 |
| 2012/0291099 | A1 | 11/2012 | Grube et al. | |
| 2012/0311403 | A1 | 12/2012 | Gladwin et al. | |
| 2013/0013959 | A1 | 1/2013 | Grube et al. | |
| 2013/0013960 | A1 | 1/2013 | Gladwin et al. | |

FOREIGN PATENT DOCUMENTS

| | | |
|---|---|---|
| CN | 101630282 | 1/2010 |
| CN | 101840377 | 9/2010 |
| CN | 102012792 | 4/2011 |
| CN | 102427556 | 4/2012 |
| CN | 102546755 | 7/2012 |
| CN | 102681793 | 9/2012 |
| EP | 0631442 | 12/1994 |
| EP | 0762387 | 3/1997 |
| EP | 1017175 | 7/2000 |
| EP | 1148715 | 10/2001 |
| EP | 1599013 | 11/2005 |
| EP | 1633112 | 3/2006 |
| EP | 1686581 | 8/2006 |
| EP | 1898600 | 3/2008 |
| EP | 1914730 | 4/2008 |
| EP | 1936921 | 6/2008 |
| EP | 2164006 | 8/2009 |
| EP | 2282260 | 9/2011 |
| GB | 2471527 | 1/2011 |
| JP | H02501869 A | 6/1990 |
| KR | 2012/0094782 | 8/2012 |
| RU | 2011136622 | 3/2013 |
| WO | WO 97/29486 | 8/1997 |
| WO | WO 98/02864 | 1/1998 |
| WO | WO 99/40722 | 8/1999 |
| WO | WO 03/034618 | 4/2003 |
| WO | WO 03/056557 | 7/2003 |
| WO | WO 2004/059529 | 7/2004 |
| WO | WO 2005/041045 | 5/2005 |
| WO | WO 2005/043530 | 5/2005 |
| WO | WO 2005/043531 | 5/2005 |
| WO | WO 2007/010189 | 1/2007 |
| WO | WO 2007/076077 | 7/2007 |
| WO | WO 2007/079395 | 7/2007 |
| WO | WO 2007/115317 | 10/2007 |
| WO | WO 2008/079222 | 7/2008 |
| WO | WO 2008/103569 | 8/2008 |
| WO | WO 2009/039336 | 3/2009 |
| WO | WO 2009/052021 | 4/2009 |
| WO | WO 2009/135630 | 11/2009 |
| WO | WO 2010/033644 | 3/2010 |
| WO | WO 2010/045511 | 4/2010 |
| WO | WO 2010/068380 | 6/2010 |
| WO | WO 2010/091101 | 8/2010 |
| WO | WO 2011/002741 | 1/2011 |
| WO | WO 2011/014823 | 2/2011 |
| WO | WO 2011/038034 | 3/2011 |
| WO | WO 2011/066236 | 6/2011 |
| WO | WO 2011/066238 | 6/2011 |
| WO | WO 2011/068527 | 6/2011 |
| WO | WO 2011/101482 | 8/2011 |
| WO | WO 2011/112385 | 9/2011 |
| WO | WO 2012/008921 | 1/2012 |
| WO | WO 2012/027646 | 3/2012 |
| WO | WO 2012/047468 | 4/2012 |
| WO | WO 2012/048076 | 4/2012 |
| WO | WO 2012/106329 | 8/2012 |
| WO | WO 2012/117309 | 9/2012 |
| WO | WO 2012/147087 | 11/2012 |
| WO | WO 2012/170255 | 12/2012 |

OTHER PUBLICATIONS

European Search Report for EP 13 30 6435, dated Mar. 21, 2014, 9 pages.

Serfozo P et al: "Performance requirements of the Mojette transform for internet distributed databases and image processing", Optimization of Electrical and Electronic Equipment, 2008. OPTIM 2008. 11th International Conference on, IEEE, Piscataway, NJ, USA, May 22, 2008 (May 22, 2008), pp. 87-92, XP031341303, ISBN: 978-1-4244-1544-1.

N. Normand, J-P Guédon, p. Philippé, D. Barba: "Controlled Redundency for Image Coding and High-Speed Transmission", Visual Communications and Image Processing '96, Feb. 27, 1996 (Feb. 27, 1996), XP002721553, Orlando, Florida, USA Retrieved from the Internet: URL:http://proceedings.spiedigitallibrary.org/proceeding.aspx?articleid=1017964&resultClick=1 [retrieved on Mar. 11, 2014].

Verhert P et al: "N dimensional mojette transform. application to multiple description", Digital Signal Processing, 2002. DSP 2002. 2002 14th International Con Ference on Santorini, Greece Jul. 1-3, 2002, Piscataway, NJ, USA,IEEE, US, vol. 2, Jul. 1, 2002 (Jul. 1, 2002), pp. 1211-1214, XP010600072, ISBN: 978-0-7803-7503-1.

Servieres M et al: "The Mojette transform: Discrete angles for tomography", Electronics Notes in Discrete Mathematics, North-Holland, Amsterdam, NL, vol. 20, Jul. 1, 2005 (Jul. 1, 2005), pp. 587-606, XP027628124, ISSN: 1571-0653 [retrieved on Jul. 1, 2005].

Weatherspoon, Hakim, et al. "Erasure Coding vs. Replication: A Quantitative Comparison", Conference Paper, Oct. 10, 2002, 11 pgs.

Guédon, Jeanpierre, et al. The Mojette transform: theory and applications, chapters 4, 5, 7. Oct. 8, 2008, 87 pgs.

Normand, N., et al. "Controlled Redundancy for Image Coding and Highspeed Transmission", SPIE, vol. 2727, 12 pgs.

Serforzo, P., et al. "Performance requirements of the Mojette Transform for internet distributed databases and image processing", IEEE 2008, 6 pgs.

Servieres, Myriam, et al. "The Mojette transform: Discrete angles for tomography", Electronic Notes in Discrete Mathematics, 20 (2005), 20 pgs.

Verbert, Pierre, et al. "N Dimensional Mojette Transform. Application to Multiple Description", IEEE, 2002, 4 pgs.

* cited by examiner

| 3 | 2 | 0 | 0 | 4 | 1 | 1 | 8 | 6 | 4 | 2 | 3 | 7 | 1 | 4 |
FIG. 2a
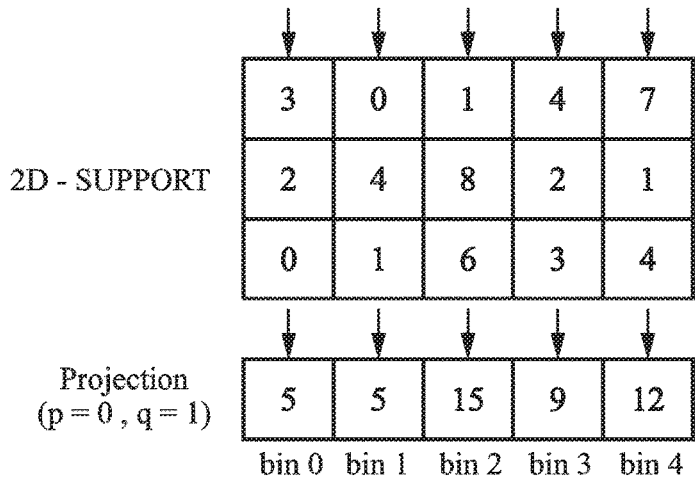
FIG. 2b
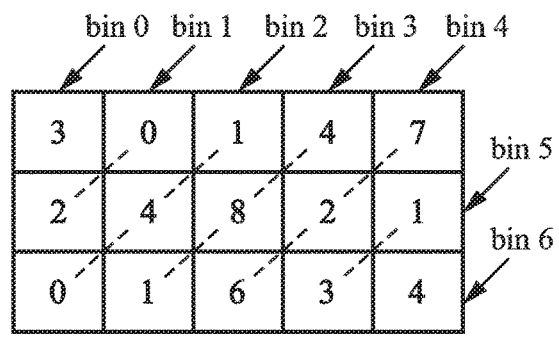
FIG. 2c

|  | | | | | |
|---|---|---|---|---|---|
| Mapping of data with erasures on 2D support | 3 | 0 | 1 | 4 | 7 |
| | 2 | 4 | 8 | 2 | 1 |
| | X | X | X | X | X |

| | | | | | |
|---|---|---|---|---|---|
| Initialization of erased values | 3 | 0 | 1 | 4 | 7 |
| | 2 | 4 | 8 | 2 | 1 |
| | 0 | 0 | 0 | 0 | 0 |

Available parity projection vector: | 5 | 5 | 15 | 9 | 12 |  ($p = 0$, $q = 1$)

Generated reconstruction projection vector: | 5 | 4 | 9 | 6 | 8 |  ($p = 0$, $q = 1$)

Updated parity projection vector: | 0 | 1 | 6 | 3 | 4 |  ($p = 0$, $q = 1$)

| | | | | | |
|---|---|---|---|---|---|
| 2D support with reconstructed line | 3 | 0 | 1 | 4 | 7 |
| | 2 | 4 | 8 | 2 | 1 |
| | 0 | 1 | 6 | 3 | 4 |

| 3 | 2 | 0 | 0 | 4 | 1 | 1 | 8 | 6 | 4 | 2 | 3 | 7 | 1 | 4 |

FIG. 3

Mapping of data with two erased lines on 2D support

| X | X | X | X | X |
|---|---|---|---|---|
| 2 | 4 | 8 | 2 | 1 |
| X | X | X | X | X |

Initialization of erased values

| 0 | 0 | 0 | 0 | 0 |
|---|---|---|---|---|
| 2 | 4 | 8 | 2 | 1 |
| 0 | 0 | 0 | 0 | 0 |

Available parity projection vector

| 3 | 1 | 7 | 7 | 11 |   |   | (p = 0, q = 1) |
|---|---|---|---|----|---|---|---|
| 3 | 0 | 1 | 5 | 13 | 3 | 4 | (p = 1, q = 1) |

Generated reconstruction projection vectors

| 2 | 4 | 8 | 2 | 1 |   |   | (p = 0, q = 1) |
|---|---|---|---|---|---|---|---|
| 0 | 2 | 4 | 8 | 2 | 1 | 0 | (p = 1, q = 1) |

Updated parity projection vectors

| 3 | 1 | 7 | 7 | 11 |   |   | (p = 0, q = 1) |
|---|---|---|---|----|---|---|---|
| 3 | 0 | 1 | 5 | 13 | 3 | 4 | (p = 1, q = 1) |

FIG. 4a

METHOD AND APPARATUS FOR RECONSTRUCTING A DATA BLOCK

RELATED APPLICATIONS

The present application is a National Phase entry of PCT Application No. PCT/EP2014/071310, filed Oct. 6, 2014, which claims priority from EP Patent Application No. 13306435.2, filed Oct. 18, 2013, said applications being hereby incorporated by reference herein in their entirety.

FIELD OF THE INVENTION

The present invention relates to a process for reconstructing a data block, and an apparatus adapted for using the same.

BACKGROUND OF THE INVENTION

Data servers capable of storing massive amount of data are used in various networks, in particular for storing the fast-growing quantity of data generated by the ever-increasing number of social networks users, or for addressing the needs of cloud network operators for managing customer data stored in the so-called "cloud". Such data centers typically include one or several data storage nodes, wherein data is stored, with the requirement that data shall be available at all time, that is, data shall be retrievable at all time. Such requirement implies that data loss or data corruption are unacceptable, which has led to security solutions consisting for the most part in the replication of stored data, with a replication factor generally equal to three but which may reach in some cases a value as high as seven.

Data replication solutions with a high replication factor are particularly sub-optimal when used with massive amount of data in that they severely increase the required data storage space and cost of associated hardware, not even mentioning the carbon footprint associated thereto. The severity of this energy and hardware cost issue and, as a consequence, the storage total cost, have been decreased through use of erasure coding techniques, such as Reed-Solomon coding.

Erasure coding generates redundancy of encoded data, the size of which is reduced as compared to strict replication of data.

The use of Reed-Solomon coding for data storage applications is discussed in "Erasure Coding vs. Replication: A Quantitative Comparison", H. Weatherspoon and J. D. Kubiatowicz, in Proceedings of the first International Workshop on Peer-to-Peer Systems (IPTP), 2002.

The execution of erasure coding and decoding algorithm when storing and retrieving data, respectively, generates latency in data storage or retrieval which should be minimized in order to leverage the full benefits of use of erasure coding in data storage solutions. This latency is increased further at the decoding stage in case of data erasure wherein erased data has to be reconstructed for complete retrieval of stored data.

There remains a need therefore for improved erasure coding and decoding algorithms, with respect to their algorithmic complexity and latency performances, in particular at the decoding stage.

SUMMARY OF THE INVENTION

It is an object of the present subject disclosure to provide systems and methods for reconstructing a data block.

A method for reconstructing a data block of size N, wherein the data block was encoded using an erasure code to generate a set of $N_s$ systematic symbol vectors and a set of $N_p$ parity projection vectors from a mapping of the data block onto a two-dimensional convex support, wherein the systematic symbol vectors correspond to symbols of the data block mapped onto the support, and the parity projection vectors respectively correspond to $N_p$ projections of symbols of the data block mapped onto the support using respective encoding projection directions, the data block being reconstructed from a set of $N_s$ input vectors using the set of $N_p$ parity projection vectors, according to an aspect of the present subject disclosure comprises, for each input vector that contains at least an erasure, updating the value of each erased symbol to a predetermined value, mapping the $N_s$ input vectors with updated values onto the two-dimensional convex support, generating a reconstruction projection vector from the mapping of the $N_s$ input vectors with updated values onto the two-dimensional convex support using an encoding projection direction, and generating an updated parity projection vector from the reconstruction projection vector and the parity projection vector generated using said encoding projection direction.

The proposed data block reconstructed schemes are advantageously based on the Mojette transform encoding scheme. The Mojette transform, described in the book entitled "The Mojette transform: theory and applications", Guedon (Ed.) et al., Wiley-ISTE, 2009, provides an encoding scheme which is not as optimum as the Reed-Solomon coding scheme, however with the advantage of a reduced complexity and latency for the decoding stage. The Mojette transform generates projection vectors calculated based on a mapping of data to be encoded onto a two-dimensional support (also referred to herein as 2D support, or 2D-support).

The proposed schemes are also advantageously based on the systematic encoding of data using the Mojette transform, which in this case provides a $(1+\varepsilon)$MDS encoding scheme, whereas the Reed-Solomon encoding scheme is an Maximum Distance Separable MDS—encoding scheme. From this standpoint, the Mojette transform is, as discussed above, a sub-optimal encoding scheme. However it can be shown that, when applicable reconstructibility criteria are fulfilled, each generated projection (or projection vector) can allow recovery of a lost line of the 2D-support. Reconstruction of the missing line may be performed using the inverse Mojette transform, with an initialization process as provided herein. Therefore, the reconstruction process may be able to reconstruct as many missing lines as the number of available projections calculated at the encoding stage.

In an embodiment, the predetermined value is zero, and the generating the updated parity projection vector comprises obtaining each value of the updated parity projection vector by subtracting the corresponding value of the reconstruction projection vector from the corresponding value of the parity projection vector generated using said encoding projection direction.

In another embodiment, the method further comprises: iteratively back-projecting on the two-dimensional convex support values of the updated parity projection vector, and updating the updated parity projection vector based on the values calculated from the back-projection.

In yet another embodiment, the $N_p$ projections of symbols of the data block mapped onto the support using respective encoding projection directions are projections of the symbols $f(k;l)$ of the mapped data block according to respective projection directions $(p_i, q_i)$, where the value at position $b_n$ of the projection vector $\text{proj}_{p_i}(b_n)$ is such that $\text{proj}_{p_i}(b_n) = \Sigma_{k=0}\Sigma_{l=0}f(k;l)\cdot\Delta(b_n+q_i\cdot k-p_i\cdot l)$, where $\Delta(.)$ is such that $\Delta(0)=1$ and $\Delta(h\neq 0)=0$.

In yet another embodiment, the two-dimensional convex support is rectangular shaped, of size P×Q, where P×Q≥N, and wherein $(P\leq P_{N_p})$ or $(Q\leq Q_{N_p})$, where $P_{N_p}$ and $Q_{N_p}$ are respectively defined as $P_{N_p}=\Sigma_{k=0}^{N_p-1}|p_i|$, and $Q_{N_p}=\Sigma_{i=0}^{N_p-1}q_i$.

In yet another embodiment, the value at position $b_n$ of the projection vector $\text{proj}_{p_i}(b_n)$ is such that $\text{proj}_{p_i}(b_n)=\Sigma_{k=0}^{P-1}\Sigma_{l=0}^{Q-1}f(k;l)\cdot\Delta(b_n+k-p_i\cdot l)$.

According to further aspects of the present disclosure, disclosed is a non-transitory computer-readable storage medium. The computer-readable storage medium can store a computer program that, when executed, causes an apparatus comprising a processor operatively coupled with a memory, to perform any of the methods disclosed herein for reconstructing a data block.

According to one or more additional aspects, disclosed is an apparatus. The apparatus may comprise a processor and a memory, operatively coupled to the processor, and may be configured to perform any of the methods disclosed herein for reconstructing a data block.

According to yet other aspects, disclosed is a computer program product comprising computer program code tangibly embodied in a computer readable medium, said computer program code comprising instruction to, when provided to a computer system and executed, cause said computer to perform any of the methods disclosed herein for reconstructing a data block.

It should be appreciated that the present invention can be implemented and utilized in numerous ways, including without limitation as a process, an apparatus, a system, a device, and as a method for applications now known and later developed.

BRIEF DESCRIPTION OF THE DRAWINGS

The present subject disclosure will be better understood and its numerous objects and advantages will become more apparent to those skilled in the art by reference to the following drawings, in conjunction with the accompanying specification, in which:

FIG. 2a illustrates an exemplary data block on which Mojette transform projections may be calculated.

FIG. 2b illustrates the calculation of a projection on a rectangular support;

FIG. 2c illustrates the calculation of projections on a rectangular support;

FIG. 3 illustrates an exemplary method for reconstructing a data block according to an example embodiment.

FIGS. 4a, 4b, and 4c illustrate an exemplary method for reconstructing a data block according to another example embodiment.

DETAILED DESCRIPTION OF THE INVENTION

Figure 1:
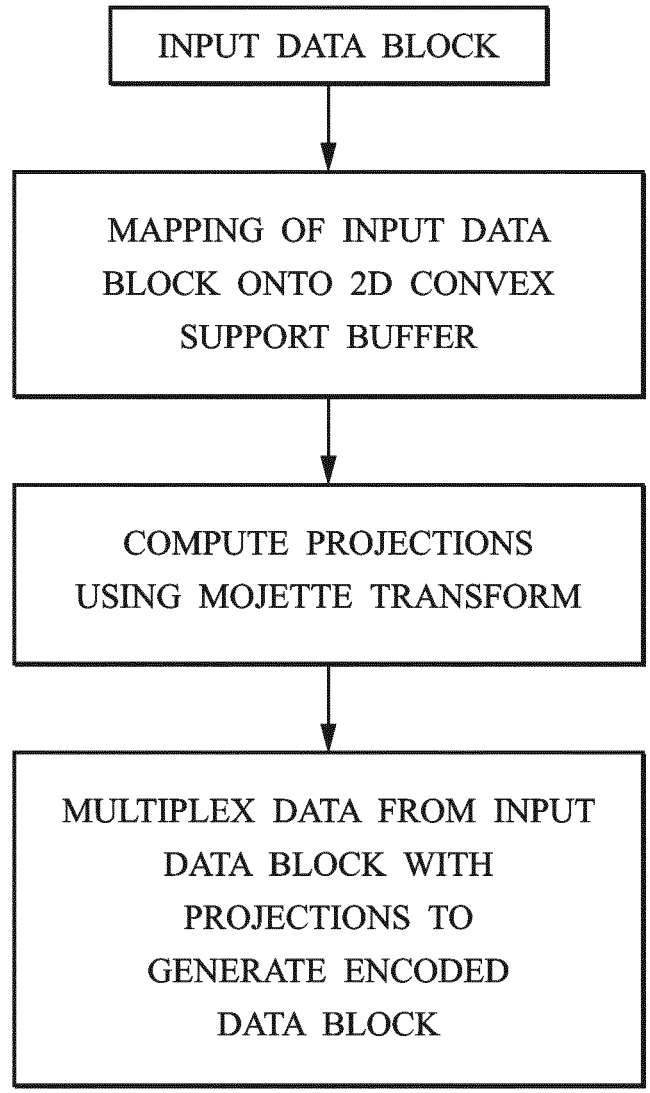
FIG. 1 illustrates an exemplary encoding of a data block of size N using a Mojette transform.

The advantages, and other features of the components disclosed herein, will become more readily apparent to those having ordinary skill in the art form. The following detailed description of certain preferred embodiments, taken in conjunction with the drawings, sets forth representative embodiments of the subject technology, wherein like reference numerals identify similar structural elements.

In addition, it should be apparent that the teaching herein can be embodied in a wide variety of forms and that any specific structure and/or function disclosed herein is merely representative. In particular, one skilled in the art will appreciate that an aspect disclosed herein can be implemented independently of any other aspects and that several aspects can be combined in various ways.

The present disclosure is described below with reference to functions, engines, block diagrams and flowchart illustrations of the methods, systems, and computer program according to one or more exemplary embodiments. Each described function, engine, block of the block diagrams and flowchart illustrations can be implemented in hardware, software, firmware, middleware, microcode, or any suitable combination thereof. If implemented in software, the functions, engines, blocks of the block diagrams and/or flowchart illustrations can be implemented by computer program instructions or software code, which may be stored or transmitted over a computer-readable medium, or loaded onto a general purpose computer, special purpose computer or other programmable data processing apparatus to produce a machine, such that the computer program instructions or software code which execute on the computer or other programmable data processing apparatus, create the means for implementing the functions described herein.

Embodiments of computer-readable media includes, but are not limited to, both computer storage media and communication media including any medium that facilitates transfer of a computer program from one place to another. As used herein, a "computer storage media" may be any physical media that can be accessed by a computer. Examples of computer storage media include, but are not limited to, a flash drive or other flash memory devices (e.g. memory keys, memory sticks, key drive), CD-ROM or other optical storage, DVD, magnetic disk storage or other magnetic storage devices, memory chip, RAM, ROM, EEPROM, smart cards, or any other suitable medium from that can be used to carry or store program code in the form of instructions or data structures which can be read by a computer processor. Also, various forms of computer-readable media may transmit or carry instructions to a computer, including a router, gateway, server, or other transmission device, wired (coaxial cable, fiber, twisted pair, DSL cable) or wireless (infrared, radio, cellular, microwave). The instructions may comprise code from any computer-programming language, including, but not limited to, assembly, C, C++, Visual Basic, HTML, PHP, Java, Javascript, and Python.

Additionally, the word "exemplary" as used herein means serving as an example, instance, or illustration. Any aspect or design described herein as "exemplary" is not necessarily to be construed as preferred or advantageous over other aspects or designs.

The proposed data block reconstruction schemes are well suited for digital data such as binary data. However it is not limited to any data format or data representation. In particular, while the exemplary embodiments disclosed herein use projections and Mojette (direct and inverse) transforms that perform summations on integer values, the present disclosure is not limited thereto, and is equally applicable to projections and Mojette (direct and inverse) transforms performed on elements having values in a Galois Field of order q GF(q), where q is an integer superior or equal to 2. In such case, the summation of integers is to be replaced with the corresponding operation in the respective Galois Field GF(q). For example, the summation of integers may be replaced with a logical XOR operation when projections and Mojette transforms are calculated on elements of GF(2), that is, binary data.

Referring to the figures, FIG. 1 illustrates an exemplary encoding of a data block of size N using a Mojette transform.

The input data block comprises N input symbols which may be binary symbols of a predetermined size. The input data block is first mapped onto a two-dimensional geometrical convex support, and then stored into memory according to the mapping. The two-dimensional geometrical convex support is chosen so that the support is completely filled with the input data block. If the size of the input data block is not sufficient to completely fill a given support, dummy data may also be inserted into the input data block so that the above condition is fulfilled.

For example, the geometrical convex support may be of a rectangular shape of size P×Q. In such case, the input data block will be stored in a memory array of size P×Q entries, which corresponds to a matrix representation of the input data block with P lines and Q columns. The dimensions of the memory array are chosen so that the input data block can be stored therein in its entirety, that is, the condition P×Q≥N is fulfilled. In the following, the position in the memory array of a symbol stored therein will be denoted f(k;l), with k=0 ... P−1, and l=0 ... Q−1.

$N_p$ parity symbol vectors (or projection vectors) are generated using projections of the symbols f(k;l) stored in the memory array according to $N_p$ projection directions per the following equation: $proj_{p_i,q_i}(b_n) = \Sigma_{k=0}^{P-1} \Sigma_{l=0}^{P-1} f(k;l) \cdot \Delta(b_n + q_i \cdot k - p_i \cdot l)$, where $b_n$ is the index of the symbols of the projection vector $\{proj_{p_i}(b_n)\}$, and $\Delta(m)$ denotes the Kronecker function ($\Delta(0)=1$, and $\Delta(m\neq 0)=0$). Each symbol f(k;l) stored in the memory array that belongs to the discrete line $n=-q_i \cdot k + p_i \cdot l$ contributes to the bin n of projection $(p_i, q_i)$.

The set of $N_p$ direction projections may be chosen so as to fulfill the so-called Katz's criterion, in order to ensure that the input data block can be reconstructed from the calculated projections. In the case of a rectangular-shaped support, the Katz's criterion can be enunciated as follows: given a set of pixels on a rectangular array of size P×Q, and a set $S_{N_p}$ of $N_p$ projection directions given by $S_{N_p} = \{(p_i, q_i), 1 \leq i \leq N_p\}$ with $|q_i|>0$, then a unique image defined on the (P×Q) can be reconstructed by the set of projections in the directions $S_{N_p}$ if ($P \leq P_{N_p}$) or ($Q \leq Q_{N_p}$), where $P_{N_p}$ and $Q_{N_p}$ are respectively defined as $P_{N_p} = \Sigma_{i=0}^{N_p-1} |p_i|$, and $Q_{N_p} = \Sigma_{i=0}^{N_p-1} q_i$. Further details on the Katz's criterion can be found in the above-mentioned book entitled: *The Mojette transform: theory and applications*.

For example, the set of $N_p$ direction projections may be chosen in view of the following conditions: $q_i=1, \forall i= 0, \ldots N_p-1, \Sigma_{i=0}^{N_p-1}|p_i| \geq P$ and $|p_i|<P$ for =0, ..., $N_p-1$, each of the projection direction parameters $p_i$ being an integer. In this case $N_p$ parity symbol vectors (or projection vectors) may be generated using projections of the symbols f(k;l) stored in the memory array according to $N_p$ directions $p_i$ per the following equation: $proj_{p_i}(b_n) = \Sigma_{k=0}^{P-1} \Sigma_{l=0}^{Q-1} (k;l) \cdot \Delta(b_n + k - p_i \cdot l)$, where $b_n$ is the index of the symbols of the projection vector $\{proj_{p_i}(b_n)\}$, and $\Delta(m)$ denotes the Kronecker function ($\Delta(0)=1$, and $\Delta(m\neq 0)=0$).

The input data block and the parity vectors are then multiplexed to generate a set of encoded data which comprises systematic data (i.e. data of the input data block) as well as parity data (i.e. symbols of the parity vectors, that is, of the calculated projections). This set of encoded data constitutes the output of the encoding, which may be used for storage, in which case both systematic data and parity data are stored, thereby providing redundancy without the cost of data replication, possibly in distributed storage.

Distributed storage may be used with systematic data and parity data stored in different memory units, or with different storage parameters. For example, replication may be used for storing parity data whereas it may not be used for systematic data. In addition, systematic data and parity data may themselves be stored in a distributed manner. In each case distributed storage may be used so as to distribute stored data in a manner in which protection thereof against storage unit failure is optimum.

FIGS. 2a, 2b and 2c illustrate the encoding of an exemplary data block using Mojette transform projections.

Shown on FIG. 2a is a data block of size 15, to be encoded.

On FIG. 2b data of the same data block is shown in a matrix representation of size 3×5, with 3 lines and 5 columns. A first parity vector $proj_{p_0}(b_n)$ is generated using a projection with a direction defined by the horizontal direction parameter $p_0$, where $p_0=0$. As discussed above, the direction with this horizontal parameter value corresponds to the vertical direction, that is, the direction defined by the columns of the matrix representation, so that each element (also referred to as symbol herein) $proj_{p_0}(b_n)$ of the parity vector is determined by calculation of the sum of the respective column elements of the matrix representation.

In the example, the generated parity vector is $\{proj_{p_0}(b_n)\}_{n=0 \ldots 4} = \{5; 5; 15; 9; 12\}$ where $proj_{p_0}(b_0)=5=3+2+0$, $proj_{p_0}(b_1)=5=0+4+1$, $proj_{p_0}(b_2)=15=1+6+8$, $proj_{p_0}(b_3)=9=4+2+3$, and $proj_{p_0}(b_4)=12=7+1+4$.

On FIG. 2c data of the data block is shown in the same matrix representation of size 3×5. A second parity vector $proj_{p_1}(b_n)$ is generated using a projection with a direction defined by the horizontal direction parameter $p_1$, where $p_1=1$. The direction with this horizontal parameter value corresponds to the direction defined by the diagonals of the matrix representation, so that each element (also referred to as symbol herein) $proj_{p_1}(b_n)$ of the parity vector is determined by calculation of the sum of the elements on respective diagonals of the matrix representation as illustrated on the figure.

In the example, the generated parity vector is $\{proj_{p_1}(b_n)\}_{n=0 \ldots 6} = \{3; 2; 5; 13; 15; 4; 4\}$ where $proj_{p_1}(b_0)=3=3$, $proj_{p_1}(b_1)=2=0+2$, $proj_{p_1}(b_2)=5=1+4+0$, $proj_{p_1}(b_3)=13=4+8+1$, $proj_{p_1}(b_4)=15=7+2+6$, $proj_{p_1}(b_5)=4=1+3$, and $proj_{p_1}(b_6)=4=4$.

Therefore the encoding of the data block of size 15 generates a systematic data block that corresponds to the encoded data and 2 parity vectors whose symbols are determined by calculating projections of the elements of a matrix representation of the encoded data. In the example, the total size of systematic data and parity data is 27. In order words, the coding rate of the illustrated encoding is 1.8.

Shown on FIG. 3 is the reconstruction of the data block shown on FIG. 2a according to an embodiment.

In this example, one of the systematic vectors has been lost, so that the available systematic vectors only allow the mapping of two out of three systematic vectors onto the rectangular support (matrix representation of size 3×5 on FIG. 3). The mapping is reconstituted with available vectors (3; 0; 1; 4; 7) and (2; 4; 8; 2; 1) which correspond to the first two lines of the mapping, and the values of the last line that are missing due to erasures are initialized with a predetermined value (in the illustrated example such predetermined value is equal to 0).

Also shown on FIG. 3 is the available parity vector which was generated at encoding using a projection of the values of the encoding mapping according to the projection direction (p=0;q=1).

Once the mapping is reconstituted with initialization values replacing erasures, a reconstruction projection vector is generated by calculating the projection vector on the reconstituted mapping according to the same projection direction as the ones for which a parity projection vector is available, in this case the projection direction (p=0;q=1).

In the example, the generated reconstruction projection vector is $\{reconstruct\_proj_{p_0}(b_n)\}_{n=0 \ldots 4}=\{5; 4; 9; 6; 8\}$ where: $reconstruct\_proj_{p_0}(b_0)=5=3+2+0$, $reconstruct\_proj_{p_0}(b_1)=4=0+4+0$, $reconstruct\_proj_{p_0}(b_2)=9=1+8+0$, $reconstruct\_proj_{p_0}(b_3)=6=4+2+0$, and $reconstruct\_proj_{p_0}(b_4)=8=7+1+0$.

An updated parity projection vector is then generated from the reconstruction projection vector (5; 4; 9; 6; 8) and the parity projection vector generated using the projection direction (p=0;q=1), that is, the vector (5; 5; 15; 9; 12). In the example, the updated parity projection vector is generated by subtracting the values of the reconstruction projection vector from the corresponding values of the parity projection vector, leading to the updated parity projection vector (0; 1; 6; 3; 4).

In some embodiments, the values of the updated parity projection vector are back-projected onto the reconstituted mapping so as to replace the initialization values with reconstructed ones. In the illustrated example, the back-projection of the updated parity projection vector (0; 1; 6; 3; 4) onto the (3×5) rectangular support leads to the initial rectangular support mapping, so that the lost data has been recovered using the available systematic data and available parity data.

The operation of backprojection is described in details in chapter 4 ("Reconstructability with the Inverse Mojette Transform") of the above-mentioned book entitled "The Mojette transform: theory and applications".

Figure 4B:
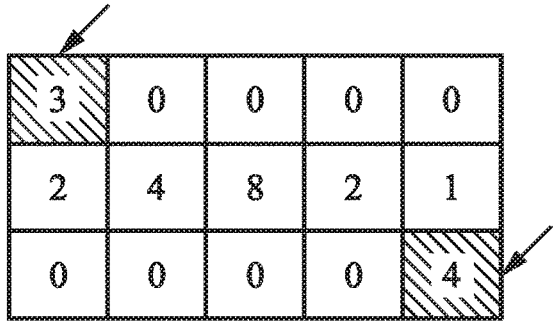
Figure 4B:
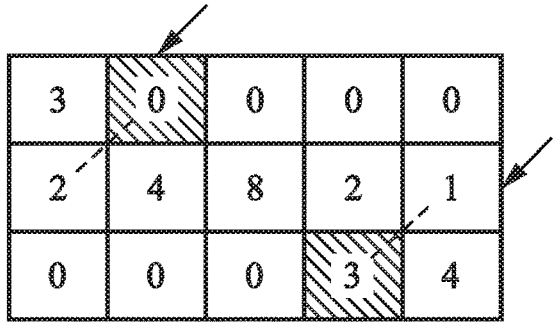

Shown on FIGS. 4a and 4b is the reconstruction of the data block shown on FIG. 2a according to another embodiment.

In this example, two of the systematic vectors have been lost, so that the available systematic vectors only allow the mapping of one out of three systematic vectors onto the rectangular support (matrix representation of size 3×5 on FIG. 4a). The mapping is reconstituted with the only available vector (2; 4; 8; 2; 1) which corresponds to the second line of the mapping, and the values of the first and last lines that are missing due to erasures are initialized with a predetermined value (in the illustrated example such predetermined value is equal to 0).

Also shown on FIG. 4a are the available parity vectors which were generated at encoding using projections of the values of the encoding mapping according to the projection directions (p=0;q=1) and (p=1;q=1), respectively.

Once the mapping is reconstituted with initialization values replacing erasures, reconstruction projection vectors are generated by calculating the projection vectors on the reconstituted mapping according to the same projection directions as the ones for which parity projection vectors are available, in this case the projection directions (p=0;q=1) and (p=1;q=1).

In the example, the first generated reconstruction projection vector is $\{reconstruct\_proj_{p_0}(b_n)\}_{n=0 \ldots 4}=\{2; 4; 8; 2; 1\}$ where: $reconstruct\_proj_{p_0}(b_0)=2=0+2+0$, $reconstruct\_proj_{p_0}(b_1)=4=0+4+0$, $reconstruct\_proj_{p_0}(b_2)=8=0+8+0$, $reconstruct\_proj_{p_0}(b_3)=2=0+2+0$, and $reconstruct\_proj_{p_0}(b_4)=1=0+1+0$.

The second generated reconstruction projection vector is $\{reconstruct\_proj_{p_1}(b_n)\}_{n=0 \ldots 6}=\{0; 2; 4; 8; 2; 1; 0\}$ where $reconstruct\_proj_{p_1}(b_0)=0=0$, $reconstruct\_proj_{p_1}(b_1)=2=0+2$, $reconstruct\_proj_{p_1}(b_2)=4=0+4+0$, $reconstruct\_proj_{p_1}(b_3)=8=0+8+0$, $reconstruct\_proj_{p_1}(b_4)=2=0+2+0$, $reconstruct\_proj_{p_1}(b_5)=1=1+0$, and $reconstruct\_proj_{p_1}(b_6)=0=0$.

Updated parity projection vectors are then generated from the reconstruction projection vectors (2; 4; 8; 2; 1) and (0; 2; 4; 8; 2; 1; 0), on the one hand, and the parity projection vectors generated using the projection directions (p=0;q=1) and (p=1;q=1), that is, the vectors (5; 5; 15; 9; 12) and (3; 2; 5; 13; 15; 4; 4). In the example, the updated parity projection vectors are generated by subtracting the values of the reconstruction projection vector from the corresponding values of the parity projection vector generated using the same projection direction as the reconstruction projection vector, leading to the updated parity projection vectors (3; 1; 7; 7; 11) and (3; 0; 1; 5; 13; 3; 4).

In some embodiments, and iterative Mojette reconstruction algorithm using back-projections is performed to complete the reconstruction of the initial data block.

The Mojette reconstruction algorithm performs iterations each of which include the identification of a value in an available projection (those values are also called bins) which can be back-projected, that is, a bin for which only one value in the two-dimensional support remains unknown for its corresponding line of projection. The iteration also includes, once the bin that can be back-projected is identified, the determination of which one of the values f(k;l) in the two-dimensional support, in the line of projection, $b=k \cdot q_i - l \cdot p_i$, is yet to be reconstructed.

Those operations can make use of two sets of projections calculated with the same set of projection angles on the two-dimensional support with values that are all equal to 1 (the 2D-support is then called a unitary image) on the one hand, and with values that are equal to $f(k;l)=k+l \cdot P$, where P is the width of the support (the 2D support is then called an index image).

Reconstructible bins are identified in the unitary image by a bin value equal to 1 (one value in the 2D-Support for this bin). For each one, the corresponding bin in the transform of the index image directly gives the location of the value in the 2D-support to reconstruct.

After reconstructing a value in the 2D support, the available projections are updated in order to remove the contribution of the reconstructed value.

FIG. 4b shows as an example the two updated parity projections obtained based on the reconstruction projections and the available parity projections of the above-mentioned exemplary embodiment illustrated on FIG. 4a, together with the number of values in the 2D-support corresponding to each bin value.

For example, in the second updated parity projection, the bin value 3 corresponds to a single value on the 2D-support, the bin value 0 corresponds to two values on the 2D-support, the bin values 1, 5, and 13 each corresponds to three values on the 2D-support, the bin value 3 corresponds to two values on the 2D-support, and the bin value 4 corresponds to a single value on the 2D-support.

For the first updated parity projection, given the projection direction, all the bin values corresponds to as many values as there are lines in the 2D-support, that is, in the example, 3 values.

The two bins which correspond to one value of the 2D-support can be back-projected according to the projection direction that corresponds to the second updated parity projection.

The back-projections provides a 2D-support in which two of the missing values are inserted, and the second updated parity projections can then be updated again, based on the updated values in the 2D-support.

Two further missing values in the 2D support can also be reconstructed, based on the bin values in the second updated parity projection which correspond to two values in the 2D-support.

Shown on FIG. 4b are the two bins in the second updated parity projection which correspond to two values in the 2D-support, that is, the second and sixth bins, respectively corresponding to values 0 and 3. Those two values are also back-projected in the 2D support.

Figure 4C:
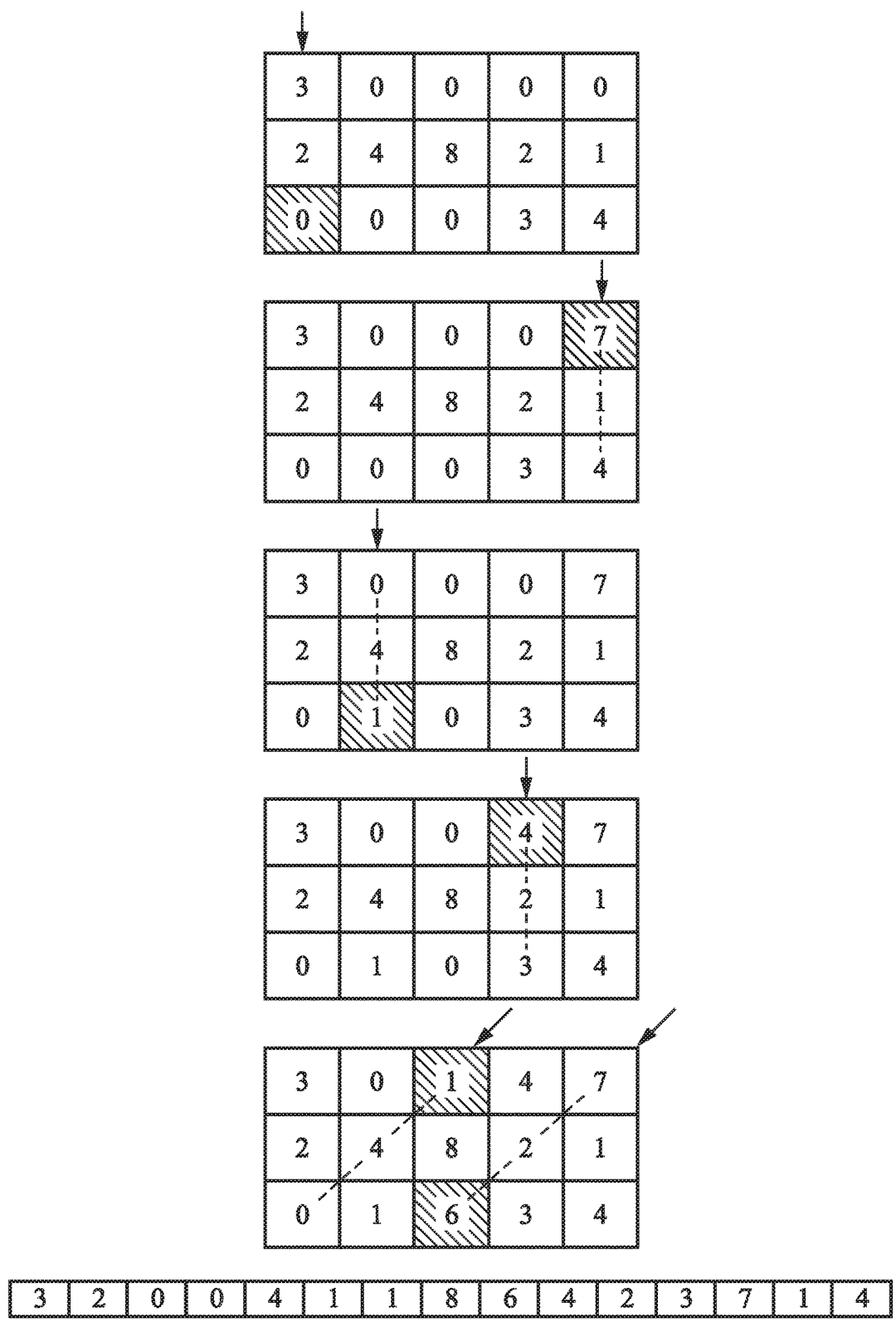

Exemplary following steps of the reconstruction algorithm are shown on FIG. 4c. With reference to FIG. 4c, four remaining missing values in the 2D support can also be reconstructed, based on the bin values in the first updated parity projection. As discussed above, the bin values of the first updated parity projection correspond to three values in the 2D-support, however at this stage of the reconstruction two values are available for each of the four reconstructed values either because they were among the non-erased data in the initial 2D-support or because they have already been reconstructed.

The reconstruction of each of those 4 values is illustrated on FIG. 4c wherein each reconstructed value is highlighted in grey.

Finally, the last two erased missing values are reconstructed using the bin values of the second updated parity projection. As was the case for the first updated parity projection, bin values of the second updated parity projection corresponding to three values in the 2D-support can be used at this stage of the reconstruction, as two of those values are at this stage available.

While the updating of the parity projections at each iteration of the reconstruction loop is not shown for the sake of simplifying the example, the reconstruction algorithm may use such iterated updates in order to calculate the values to be back-projected onto the 2D support.

The back-projection of updated parity projection values onto the (3×5) rectangular support can then lead to the initial rectangular support mapping, so that the lost data may be recovered using the available systematic data and available parity data.

Figure 5:
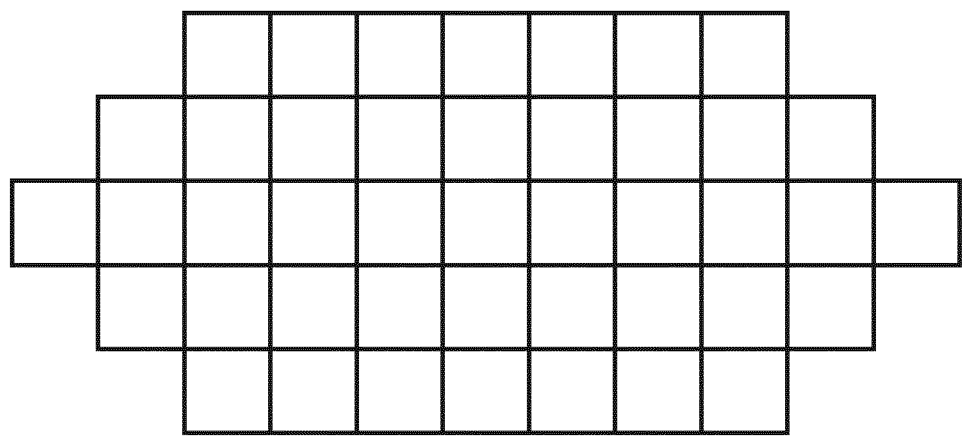
FIG. 5 illustrates a convex support on which the invention may be applied.

The proposed processes for initializing the reconstruction of erased data mapped on a two-dimensional support may also be applied to non-rectangular convex supports. FIG. 5 shows an example of such a convex 2D support to which the proposed processes may be applied. In the example shown on FIG. 5, the depth of the support, which is defined as the number of lines thereof, is equal to 5.

Different criteria for reconstructing encoded data mapped to such a convex support may be found in the above-mentioned book "The Mojette transform: theory and applications".

Figure 6:
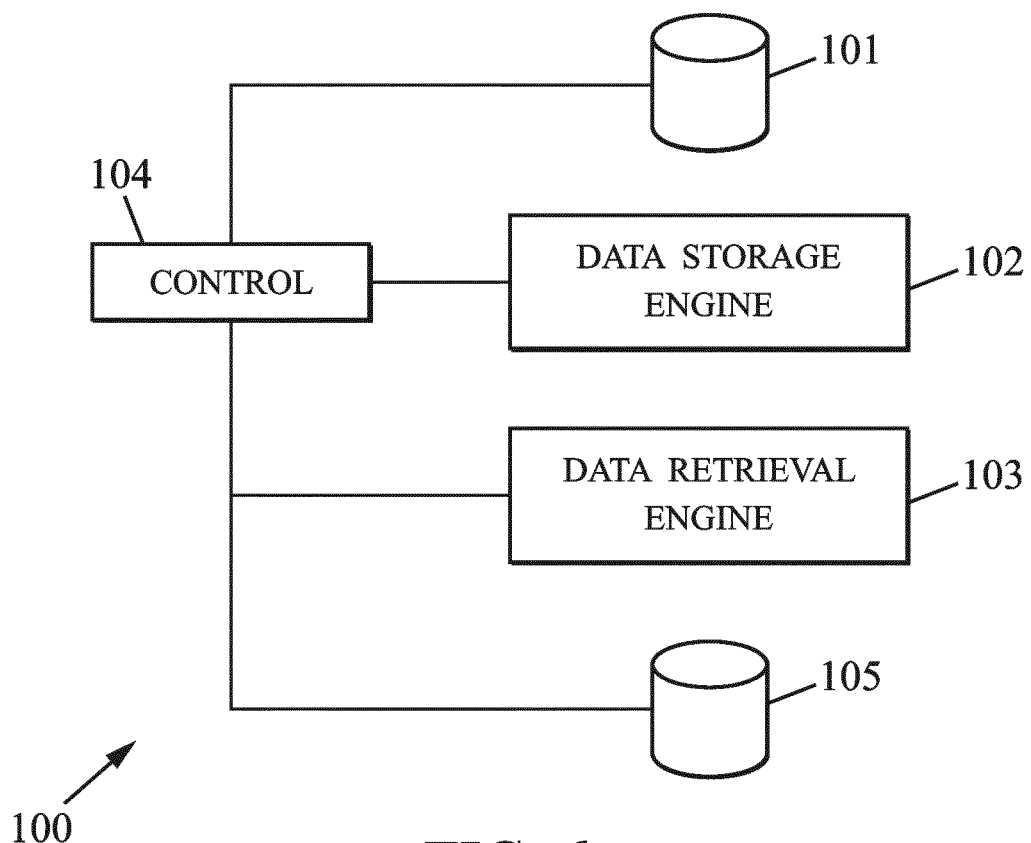
FIG. 6 illustrates an example data storage/retrieval system according to an example embodiment.

Referring to the figures, FIG. 6 illustrates an exemplary data storage/retrieval system 100 configured to use a reconstruction scheme in accordance with the present disclosure. The data storage/retrieval system 100 is a computer system which includes a data storage memory 101, a data storage engine 102, a data retrieval engine 103, a control engine 104, and a data memory 105. In the architecture illustrated on FIG. 1, all of the data storage memory 101, data storage engine 102, data retrieval engine 103, and data memory 105 are operatively coupled with one another through the control engine 104.

In one embodiment, the data storage memory 101 is a database for storing data that includes systematic data and parity data generated from the systematic data, possibly in a distributed manner. That is, the data storage memory 101 may comprise a plurality of memory banks or memory modules in which data is stored in a distributed manner. As discussed above, systematic data may not be stored collocated with parity data.

In an embodiment, the control engine 104 includes a processor, which may be any suitable microprocessor, ASIC, and/or state machine. According to various embodiments, one or more of the computers can be configured as a multi-processor computer having multiple processors for providing parallel computing. The control engine 104 may also comprise, or may be in communication with, computer storage media, such as, without limitation, the data memory 105, capable of storing computer program instructions or software code that, when executed by the processor, cause the processor to perform the elements described herein. The data storage memory 101 and other data memory 105 may be any computer storage medium coupled to the control engine 104 and operable with one or more associated database management systems to facilitate management of data stored in respective databases and associated hardware.

It will be appreciated that data storage/retrieval system 100 shown and described with reference to FIG. 6 is provided by way of example only. Numerous other architectures, operating environments, and configurations are possible. Other embodiments of the system may include fewer or greater number of components, and may incorporate some or all of the functionality described with respect to the system components shown in FIG. 6. Accordingly, although the data storage memory 101, data storage engine 102, data retrieval engine 103, control engine 104, and data memory 105 are illustrated as part of the data storage/retrieval system 100, no restrictions are placed on the location and control of components 101-105. In particular, in other embodiments, components 101-105 may be part of different entities or computing systems.

Further, it should be noted that the data storage engine 102 and/or data retrieval engine 103 may include a processor-driven device, and include a processor and a memory operatively coupled with the processor, and may be implemented in software, in hardware, firmware or a combination thereof to achieve the capabilities and perform the functions described herein.

In some embodiments, the data storage engine 102 is configured to manage the systematic encoding of data which are to be stored in the data storage memory 101. The data storage engine is configured to generate through Mojette transform encoding one or several parity projection vectors which will be included in the stored parity data associated with the stored systematic data which has been encoded.

In some embodiments, the data retrieval engine 103 is configured to perform the reconstruction scheme disclosed herein, based on available systematic data and parity data retrieved from the data storage memory 101.

While the invention has been described with respect to preferred embodiments, those skilled in the art will readily appreciate that various changes and/or modifications can be made to the invention without departing from the scope of the invention as defined by the appended claims. In particular, the invention is not limited to specific embodiments regarding the disclosed system architecture, and may be implemented using various system architectures and components without departing from its scope as defined by the appended claims.

Although this invention has been disclosed in the context of certain preferred embodiments, it should be understood that certain advantages, features and aspects of the systems, devices, and methods may be realized in a variety of other embodiments. Additionally, it is contemplated that various aspects and features described herein can be practiced separately, combined together, or substituted for one another, and that a variety of combination and subcombinations of the features and aspects can be made and still fall within the scope of the invention. Furthermore, the systems and devices described above need not include all of the modules and functions described in the preferred embodiments.

In particular, although the present invention has been disclosed in the context of data storage/retrieval systems, it can be applied in the context of data transmission through a transmission channel, e.g. a wireless transmission channel. In such context, the reconstruction schemes disclosed herein may be used by a device implementing decoding of received data and reconstructing lost or erroneously received data.

Information and signals described herein can be represented using any of a variety of different technologies and techniques. For example, data, instructions, commands, information, signals, bits, symbols, and chips can be represented by voltages, currents, electromagnetic waves, magnetic fields or particles, optical fields or particles, or any combination thereof.

Depending on the embodiment, certain acts, events, or functions of any of the methods described herein can be performed in a different sequence, may be added, merged, or left out all together (e.g., not all described acts or events are necessary for the practice of the method). Moreover, in certain embodiments, acts or events may be performed concurrently rather than sequentially.

The invention claimed is:

1. A computer-implemented method for data storage and retrieval from a network, the method comprising:
   reconstructing within a data storage memory a data block of size N, wherein the data block was encoded using an erasure code to generate a set of $N_s$ systematic symbol vectors and a set of $N_p$ parity projection vectors from a mapping of the data block onto a two-dimensional convex support, wherein the systematic symbol vectors correspond to symbols of the data block mapped onto the support, and the parity projection vectors respectively correspond to $N_p$ projections of symbols of the data block mapped onto the support using respective encoding projection directions, the data block being reconstructed from a set of $N_s$ input vectors using the set of $N_p$ parity projection vectors;
   for each input vector that contains at least an erasure, updating the value of each erased symbol to a predetermined value, said update being performed by a processor;
   mapping the $N_s$ input vectors with updated values onto the two-dimensional convex support, said mapping being performed by the processor,
   generating a reconstruction projection vector from the mapping of the $N_s$ input vectors with updated values onto the two-dimensional convex support using an encoding projection direction, said generation being performed by the processor; and
   generating an updated parity projection vector from the reconstruction projection vector and the parity projection vector generated using said encoding projection direction, said generation being performed by the processor;
   reconstructing the data block based on the updated parity projection vector and the $N_s$ input vectors, and
   retrieving the data block from the data storage memory.

2. The method of claim 1, wherein the predetermined value is zero, and the generating the updated parity projection vector comprises obtaining each value of the updated parity projection vector by subtracting the corresponding value of the reconstruction projection vector from the corresponding value of the parity projection vector generated using said encoding projection direction.

3. The method of claim 1, further comprising: iteratively back-projecting on the two-dimensional convex support values of the updated parity projection vector, and updating the updated parity projection vector based on the values calculated from the back-projection.

4. The method of claim 1, wherein the $N_p$ projections of symbols of the data block mapped onto the support using respective encoding projection directions are projections of the symbols f(k;l) of the mapped data block according to respective projection directions vectors of coordinates ($p_i$, $q_j$), j(k;l) being the symbol of the mapped data block in a position (k;l) of the two-dimensional convex support where the value at position $b_n$ in the projection vector $proj_{p_i}(b_n)$ is such that $proj_{p_i}(b_n)=\Sigma_{k=0}\Sigma_{l=0}f(k;l)\cdot\Delta(b_n+q_i\cdot k-p_i\cdot l)$, where k, l, $p_i$, $q_i$, $b_n$ are integers, and $\Delta(.)$ is the Kronecker function, that is, the function such that $\Delta(0)=1$ and $\Delta(h)=0$ if $h\neq 0$.

5. The method according to claim 1, wherein the two-dimensional convex support is rectangular shaped, of size P×Q, where P×Q≥N, and wherein ($P\leq P_{N_p}$) or ($Q\leq Q_{N_p}$), where $P_{N_p}$ and $Q_{N_p}$ are respectively defined as $P_{N_p}=\Sigma_{i=0}^{N_p-1}|p_i|$, and $Q_{N_p}=\Sigma_{i=0}^{N_p-1}q_i$ and $p_i$ and $q_i$ are integer coordinates of projection direction vectors.

6. The method according to claim 5, wherein the value at position $b_n$ in the projection vector $proj_{p_i}(b_n)$ is such that $proj_{p_i}(b_n)=\Sigma_{k=0}^{P-1}\Sigma_{i=0}^{Q-1}(k;l)\cdot\Delta(b_n+k-p_i\cdot l)$ and wherein f(k;l) is the symbol of the mapped data block in a position (k;l) of the two-dimensional convex support, where k, l, and $b_n$ are integers and $\Delta(.)$ is the Kronecker function, that is, the function such that $\Delta(0)=1$ and $\Delta(h)=0$ if $h\neq 0$.

7. An apparatus comprising a processor and a data storage memory operatively coupled to the processor, wherein the apparatus is configured to store data and retrieve data from a network, by reconstructing a data block of size N, wherein the data block was encoded using an erasure code to generate a set of $N_s$ systematic symbol vectors and a set of $N_p$ parity projection vectors from a mapping of the data block onto a two-dimensional convex support, wherein the systematic symbol vectors correspond to symbols of the data block mapped onto the support, and the parity projection vectors respectively correspond to $N_p$ projections of symbols of the data block mapped onto the support using respective encoding projection directions, the data block being reconstructed from a set of $N_s$ input vectors using the set of $N_p$ parity projection vectors, the apparatus being further configured to:
   for each input vector that contains at least an erasure, update the value of each erased symbol to a predetermined value;
   map the $N_s$ input vectors with updated values onto the two-dimensional convex support,
   generate a reconstruction projection vector from the mapping of the $N_s$ input vectors with updated values onto the two-dimensional convex support using an encoding projection direction; and generate an updated parity projection vector from the reconstruction projection vector and the parity projection vector generated using said encoding projection direction; and retrieving the data block from the data storage memory.

8. The apparatus according to claim 7, wherein the predetermined value is zero, and the apparatus is further configured to generate the updated parity projection vector by obtaining each value of the updated parity projection vector by subtracting the corresponding value of the reconstruction projection vector from the corresponding value of the parity projection vector generated using said encoding projection direction.

9. The apparatus according to claim 7, wherein the apparatus is further configured to iteratively back-project on the two-dimensional convex support values of the updated parity projection vector, and update the updated parity projection vector based on the values calculated from the back-projection.

10. The apparatus according to claim 7, wherein the $N_p$ projections of symbols of the data block mapped onto the support using respective encoding projection directions are projections of the symbols $f(k;l)$ of the mapped data block according to respective projection direction vectors of coordinates $(p_i,q_i) f(k;l)$ being the symbol of the data block in a position $(k;l)$ of the two-dimensional convex support, where the value at position $b_n$ in the projection vector $proj_{p_i}(b_n)$ is such that $proj_{p_i}(b_n) = \Sigma_{k=0} \Sigma_{l=0} f(k;l) \cdot \Delta(b_n+q_i \cdot k - p_i \cdot l)$, where k, l, $p_i$, $q_i$, $b_n$ are integers, and $\Delta(.)$ is the Kronecker function, that is, the function such that $\Delta(0)=1$ and $\Delta(h)=0$ if $h \neq 0$.

11. The apparatus according to claim 7, wherein the two-dimensional convex support is rectangular shaped, of size P×Q, where P×Q≥N, and wherein $(P \geq \Sigma_{i=0}^{N_p-1})$ or $(Q \leq \Sigma_{i=0}^{N_p-1} q_i)$ where $p_i$ and $q_i$ are integer coordinates of projection direction vectors $(p_i, q_i)$, $p_i$ and $q_i$ are integers.

12. The apparatus according to claim 7, wherein the value at position $b_n$ of the projection vector $proj_{p_i}(b_n)$ is such that $proj_{p_i}(b_n) = \Sigma_{k=0}^{P-1} \Sigma_{l=0}^{Q-1} f(k;l) \cdot \Delta(b_n+k-p_i \cdot l)$ and wherein $f(k;l)$ is the symbol of the mapped data block in a position $(k;l)$ of the two-dimensional convex support and where $p_i$ is integer coordinates of projection direction vectors $(p_1,1)$, where $b_n$ is the position in the projection vector $proj_{p_i}(b_n)$, where k, l, $p_i$, and $b_n$ are integers and $\Delta(.)$ is the Kronecker function, that is, the function such that $\Delta(0)=1$ and $\Delta(h)=0$ if $h \neq 0$.

13. A non-transitory computer-readable storage medium storing a computer program for storing and retrieving data from a data storage memory that, when executed, causes an apparatus comprising a processor operatively coupled with a memory, to perform a method for reconstructing a data block of size N, wherein the data block was encoded using an erasure code to generate a set of $N_s$ systematic symbol vectors and a set of $N_p$ parity projection vectors from a mapping of the data block onto a two-dimensional convex support, wherein the systematic symbol vectors correspond to symbols of the data block mapped onto the support, and the parity projection vectors respectively correspond to $N_p$ projections of symbols of the data block mapped onto the support using respective encoding projection directions, the data block being reconstructed from a set of $N_s$ input vectors using the set of $N_p$ parity projection vectors, the method comprising:

for each input vector that contains at least an erasure, updating the value of each erased symbol to a predetermined value;

mapping the $N_s$ input vectors with updated values onto the two-dimensional convex support, generating a reconstruction projection vector from the mapping of the $N_s$ input vectors with updated values onto the two-dimensional convex support using an encoding projection direction;

generating an updated parity projection vector from the reconstruction projection vector and the parity projection vector generated using said encoding projection direction, and retrieving the data block from the data storage memory.

* * * * *